United States Patent [19]

de la Plaza

[11] Patent Number: 4,746,871

[45] Date of Patent: May 24, 1988

[54] DIFFERENTIAL SWITCHED CAPACITOR INTEGRATOR USING A SINGLE INTEGRATION CAPACITOR

[75] Inventor: Alejandro de la Plaza, Bergamo, Italy

[73] Assignee: SGS Microelettronica S.p.A., Catania, Italy

[21] Appl. No.: 919,058

[22] Filed: Oct. 15, 1986

[30] Foreign Application Priority Data

Oct. 29, 1985 [IT] Italy .............................. 22641 A/85

[51] Int. Cl.[4] .......................... G06G 7/18; H03K 5/00

[52] U.S. Cl. ...................................... 328/127; 307/494

[58] Field of Search ................ 328/127, 151; 307/490, 307/494; 330/09; 333/19

[56] References Cited

U.S. PATENT DOCUMENTS 4,352,069 9/1982 Dessoulavy ......................... 328/127

*Primary Examiner*—Stanley D. Miller

*Assistant Examiner*—Timothy P. Callahan

*Attorney, Agent, or Firm*—Pollock, Vande Sande & Priddy

[57] ABSTRACT

A differential switched capacitor type integrator, particularly useful for building analog sampled-data switched capacitor filters, utilizes a single integration capacitor (or array of unitary capacitors connected in parallel) instead of the two distinct integration capacitors required in the known differential integrators. The number of the required capacitors is therefore reduced to one half in comparison to that required in accordance with the prior art.

4 Claims, 1 Drawing Sheet

DIFFERENTIAL SWITCHED CAPACITOR INTEGRATOR USING A SINGLE INTEGRATION CAPACITOR

FIELD OF THE INVENTION

The present invention relates generally to sampled-data, switched-capacitor filters, and more specifically to an improved fully differential switched capacitor integrator using less capacitance and a smaller number of capacitors for monolithic systems and subsystems, that is realized on a single chip of semiconductor material according, for example, to one of the modern MOS (Metal-Oxide-Semiconductor) technologies.

The switched capacitor integrator represents the basic circuit block used to build analog sample-data switched-capacitor filters.

BACKGROUND OF THE INVENTION

Fully differential switched capacitor integrators generally include an input path including two sampling capacitors, a fully differential amplifier, two integration capacitors and eight switches. A typical example of a differential switched capacitor integrator made according to the known technique is illustrated in FIG. 1 wherein the sampling capacitors are, respectively, $C_{s1}$ and $C_{s2}$ both having a capacitance $C_s$.

During a certain period of time which may be named phase-1, the clock generator $V_{cl1}$ forces the switches $S_{w1}$, $S_{w2}$, $S_{w3}$ and $S_{w4}$ in the low resistance mode. Simultaneously the clock generator $V_{cl2}$ forces the switches $S_{w5}$, $S_{w6}$, $S_{w7}$ and $S_{w8}$ into the high resistance mode. During such a period of time or phase-1, the sampling capacitors are charged to the input voltage and acquire an electric charge equal to:

$$\frac{1}{2} \cdot V_i \cdot C_s$$

During the successive period of time named phase-2, the clock generator $V_{cl1}$ forces the switches $S_{w1}$, $S_{w2}$, $S_{w3}$ and $S_{w4}$ into the high resistance mode and the clock generator $V_{cl2}$ forces the switches $S_{w5}$, $S_{w6}$, $S_{w7}$ and $S_{w8}$ into the low resistance mode. The differential amplifier determines the transfer of charge from the sampling capacitor into the integration capacitors $C_i$ having a capacitance C.

Assuming that the charge transfer is complete, a z-transform expression representative of such a function is the following:

$$V_o = V_o \cdot z^{-1} + V_{in} \cdot z^{-1} \cdot C_s / C$$

This expression is typical of a sampled data integrator having a time constant given by $T \cdot (C_s/C)$;

wherein T is the time interval equal to the sum of the periods of time corresponding respectively to phase-1 and to phase-2.

Recourse to differential signal processing potentially reduces noise coupling from power supply rails, and increases the dynamic range. For reasons of fabrication technology, the integrator capacitor is always several times larger than the sampling capacitor, is built in practice connecting in parallel capacitors of unitary value equal to $C_s$. The number n of capacitors connected in parallel is equal to the maximum integer smaller than $C/C_s$. An additional capacitor of capacitance equal to: $C - n \cdot C_s$ is also connected in parallel. This ensemble of capacitors is known as a capacitor array. In previous art configurations two arrays of unitary value capacitors are required for making a differential integrator.

On the other hand, in the majority of cases, it would be much more convenient and technologically more simple to be able to make a differential switched capacitor integrator requiring only a single array of capacitors that has a smaller total capacitance.

OBJECTIVES OF THE INVENTION

It is therefore an object of the present invention to provide a sample data differential switched capacitor integrator which uses only one integration capacitor array.

Another object of the present invention is to provide a sampled data differential switched capacitor integrator which uses only one integration capacitor requiring, in the meantime, a total capacitance smaller than that normally required according to the prior art.

SUMMARY OF THE INVENTION

These and other objectives and advantages of the invention are obtained by providing a floating integration capacitor that operates in conjunction with two sampling capacitors and two amplifiers connected as unity gain buffers. Each sampling capacitor is initially charged to a voltage equal to the difference between the input voltage and the voltage across the integration capacitor. In the following step, the two sampling capacitors are connected in series, and their combination is connected in parallel with the floating integration capacitor. The voltage across the integration capacitor, after the consequent redistribution of charges, corresponds to the value required in a sampled data integrator.

The invention will result more easily understood by describing in detail a preferred embodiment making reference to FIG. 2 which illustrates the circuit diagram of a differential switched capacitor integrator made in accordance with the present invention.

It should be understood that the invention is not intended to be limited to said preferred embodiment thereof; in fact, various modifications may be made by the experts of the field to the embodiment described herein below though remaining within the scope of the invention herein claimed.

DETAILED DESCRIPTION OF THE PRESENT INVENTION

Figure 1:
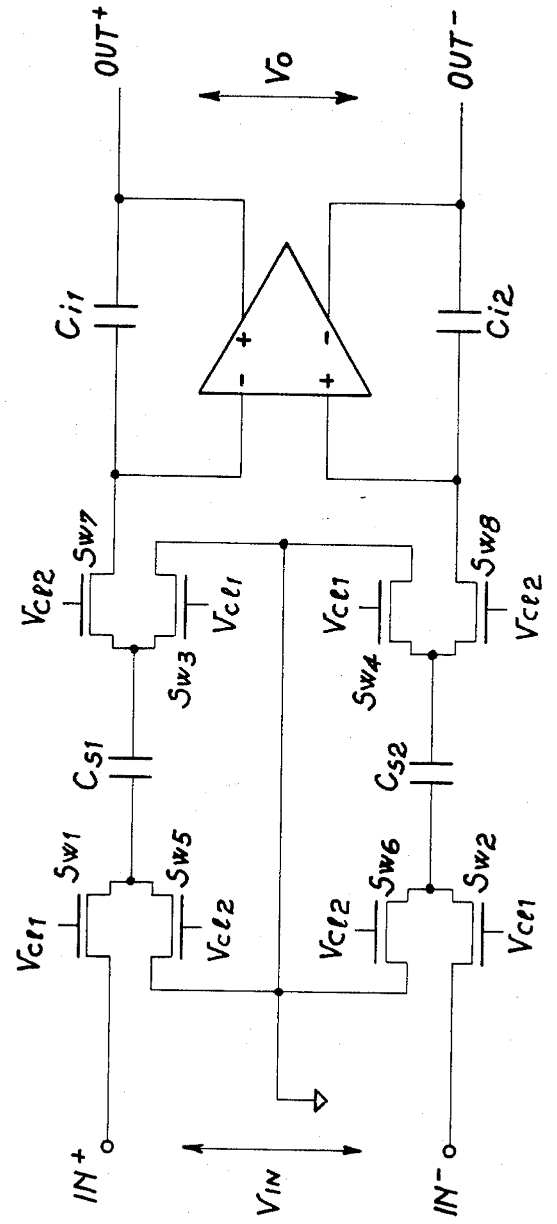
FIG. 1 illustrates a typical example of a differential switched capacitor integrator made according to a known technique.
Figure 2:
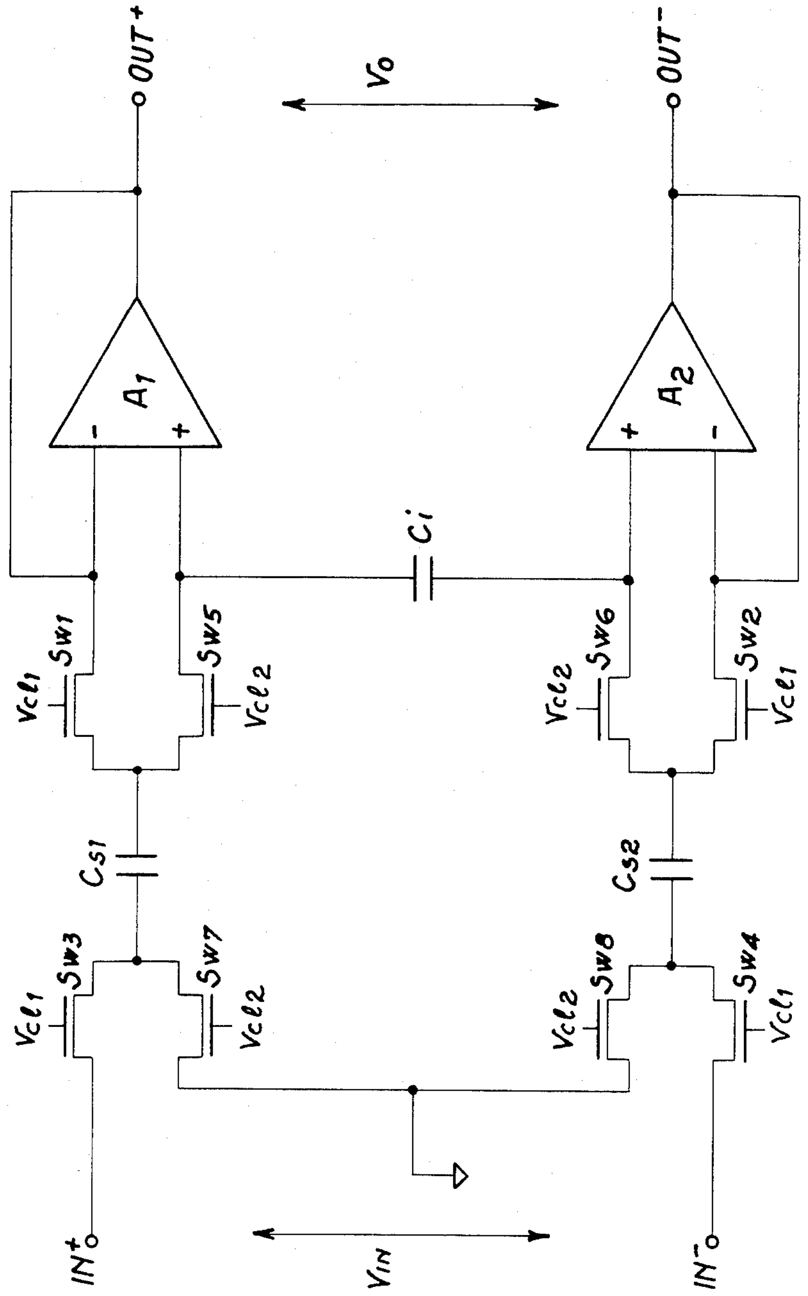
FIG. 2 illustrates a present invention differential switched capacitor sampled-data integrator.

A differential switched capacitor sampled-data integrator according to the present invention is illustrated in FIG. 2. It includes an integration capacitor $C_i$ of capacitance $C - C_s$ having one plate connected to the input of a first unity gain buffer A1 and a second plate connected to the input of a second unity gain buffer A2. A unity gain buffer (amplifier) is a circuit block known in the art as having an input node with very high input impedance and an output node having an open circuit voltage substantially equal to the voltage present at the input node and very low output impedance. The output of A1 is connected to the first output terminal OUT+ while the output of A2 is connected to the second output terminal OUT−. The sampling capacitors are respectively $C_{s1}$ and $C_{s2}$ and both have a capacitance $C_s$. The switch $S_{w1}$, controlled by the clock generator $V_{cl1}$, connects the first plate of $C_{s1}$ with the output terminal OUT+. The switch $S_{w2}$, controlled by the clock generator $V_{cl1}$, connects the first plate of the capacitor $C_{s2}$ with the output terminal OUT−. The switch $S_{w3}$, controlled by the clock generator $V_{cl1}$, connects the second plate of $C_{s1}$ with the input terminal IN+.

The switch $S_{w4}$, controlled by the clock generator $V_{cl1}$, connects the second plate of the capacitor $C_{s2}$ with the input terminal IN−.

The switch $S_{w5}$, controlled by the clock generator $V_{cl2}$, connects the first plate of the capacitor $C_{s1}$ with the first plate of the integration capacitor $C_i$. The switch $S_{w6}$, controlled by the clock generator $V_{cl2}$, connects the first plate of the capacitor $C_{s2}$ with the second plate of the integration capacitor $C_i$. The switch $S_{w7}$, controlled by the clock generator $V_{cl2}$, connects the second plate of the capacitor $C_{s1}$ with the common ground terminal. The switch $S_{w8}$, controlled by the clock generator $V_{cl2}$, connects the second plate of the capacitor $C_{s2}$ with the common ground terminal. The clock generators $V_{cl1}$ and $V_{cl2}$ generate control voltages having two distinct states or voltage levels.

When the control voltage generated by the clock generators assumes the high state or high level, all the switches subjected to such a control voltage are forced in their low resistance mode. Vice versa, when the control voltage assumes the low state or level, all associated switches are forced into their high resistance mode. The clock generators produce a clock signal which alternates its state between the high and low state in a particular sequence according to which the voltage of the two clock generators are never in the high state simultaneously. The relative clock generators are said to be non-overlapping. According to the preferred embodiment of the present invention, the switches include one or more MOS transistors with the gates used as control electrodes and the sources and drains used as controlled connecting nodes.

As it will appear of easy comprehension by observing FIG. 2, the initial conditions for the analysis of the operation of the circuit are:

the integration capacitor $C_i$ is charged to a voltage $V_0$ and has an electric charge equal to $V_0 \cdot (C - C_s)$;

the clock signal from clock generator $V_{cl1}$ is in the high state;

the clock signal from clock generator $V_{cl2}$ is in the low state.

Therefore, the clock generator $V_{cl1}$ forces the switches $S_{w1}$, $S_{w2}$, $S_{w3}$ and $S_{w4}$ in their respective conditions of low resistance mode; while the clock generator $V_{cl2}$ forces the $S_{w5}$, $S_{w6}$, $S_{w7}$ and $S_{w8}$ in their respective conditions of high resistance mode. Consequently, each sampling capacitor, that is $C_{s1}$ and $C_{s2}$, charges to a voltage equal to half the difference between the input voltage $V_{in}$ and the output voltage $V_0$, storing an electric charge equal to:

$$\tfrac{1}{2} \cdot (V_0 - V_{in}) \cdot C_s$$

In the following time period (phase-2), the signal from clock generator $V_{cl1}$ is in the low state and the clock signal from clock generator $V_{cl2}$ is in the high state, thereby forcing $S_{w5}$, $S_{w6}$, $S_{w7}$ and $S_{w8}$ into the low resistance mode and the switches $S_{w1}$, $S_{w2}$, $S_{w3}$ and $S_{w4}$ into the high redistributes mode. Electric charge redistributes itself according to the new configuration formed by the named switches in their respective conditions of low and high resistance modes. The z-transform expression for the electric charges results as the following:

$$C \cdot V_0 = V_0 \cdot z^{-1} \cdot (C - C_s) + (V_0 - V_{in}) \cdot z^{-1} \cdot C_s$$

while the expression for the output voltage results as follows:

$$V_0 = V_0 \cdot z^{-1} - V_{in} \cdot z^{-1} \cdot C_s / C$$

which corresponds to the function of a sampled-data integrator having a time constant equal to: $T \cdot C_s/C$, wherein T is the sum of the time periods in which $V_{cl1}$ is in the high state, $V_{cl2}$ is in the high state and both signals from generators $V_{cl1}$ and $V_{cl2}$ are in the low state. The circuit utilizes only one integration capacitor $C_i$ of capacitance $C - C_s$ and the total capacitance is $C + C_s$.

From the above description of the instant invention it is easily verified that the objectives are effectively obtained. In particular the differential switched capacitor sampled-data integrator of the invention utilizes a single integration capacitor and the total capacitance is one half the total capacitance required according to the approaches of the prior art.

What I claim is:

1. A differential switched capacitor integrator, operable for sampling analog differential signals coupled to two differential input terminals and for providing corresponding selectively filtered differential output signals at two differential output terminals, comprising:

two paths relative to said two differential input and output terminals at a floating potential with respect to a common ground terminal, said two paths being substantially identical and each path including:

(a) a first switch connected between a corresponding one of said input terminals and a first plate of a sampling capacitor;

(b) a second switch connected between said first plate and ground;

(c) a third switch connected between a second plate of said sampling capacitor and a corresponding one of said output terminals;

(d) a fourth switch connected between the second plate of said sampling capacitor and to a corresponding one of two plates of a floating integration capacitor;

two unity gain buffers, each respectively integrated in one of said two paths, each of said buffers having a non-inverting and an inverting input terminal and an output terminal constituting one of said two differential output terminals of the integrator, the output terminal of each unity gain buffer being short-circuited to its corresponding inverting input terminal, the non-inverting terminal of each unity gain buffer being connected to a corresponding one of the two plates of said floating integration capacitor; and first and second non-overlapping clock signals being applied, respectively, to said first and third switches and to said second and fourth switches.

2. The differential integrator of claim 1 wherein the switches and buffers are semiconductor devices.

3. The differential integrator of claim 2 wherein said semiconductor devices are MOS type devices.

4. The differential integrator of claim 1 wherein said switches are MOS transistors.

* * * * *